United States Patent [19]

Fletcher et al.

[11] 4,055,847
[45] Oct. 25, 1977

[54] GERMANIUM COATED MICROBRIDGE AND METHOD

[76] Inventors: James C. Fletcher, Administrator of the National Aeronautics and Space Administration, with respect to an invention of; Louis B. Holderman, Boyds, Md.; Palmer N. Peters, Huntsville, Ala.

[21] Appl. No.: 714,158

[22] Filed: Aug. 13, 1976

[51] Int. Cl.² .................... H01L 39/22; H01L 27/12; H01L 45/00
[52] U.S. Cl. .......................................... 357/5; 357/4; 357/73; 307/306; 338/32 S
[58] Field of Search .................... 357/4, 5, 54, 73; 331/107 S; 307/306; 338/32 S

[56] References Cited

U.S. PATENT DOCUMENTS 3,646,363  2/1972  Wright ................................ 307/306

OTHER PUBLICATIONS

Germanium–Overcoated Niobium Dayem Bridges by Holdeman et al.; Applied Physics Letter, vol. 28, No. 10, May 15, 1976, pp. 632–634.

*Primary Examiner*—Andrew J. James
*Attorney, Agent, or Firm*—L. D. Wofford, Jr.; J. H. Beumer; J. R. Manning

[57] ABSTRACT

A superconducting microbridge is provided for use in superconducting quantum interference devices wherein a pair of spaced layers of superconductive material are connected by a weak link bridge to establish an electrical junction. The superconductive layers and bridge are coated with a semiconductor material shunting the bridge at room temperatures to prevent the destruction of the device by minute electrical currents while the coating acts as a dielectric permitting normal electrical behavior of the microbridge at cryogenic temperatures.

9 Claims, 4 Drawing Figures

GERMANIUM COATED MICROBRIDGE AND METHOD

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435, 42 U.S.C. 2457).

BACKGROUND OF THE INVENTION

Superconducting microbridges are of great interest for application in superconducting quantum interference devices (SQUID). To date, however, these weak link elements have exhibited certain shortcomings which have limited their utility. The microbridges are extremely sensitive to minute electrical noises and can be destroyed by minute currents at room temperature. Unprotected microbridges can even be destroyed by electrostatic discharge when handed from one person to another. Heretofore, these weak link devices have been provided with copper wire shunts and/or current limiting series resistors to protect the devices at room temperatures. Furthermore, the temperature range of operation of these microbridges is limited by self-heating effects. These problems are especially prevalent in "Josephson junctions" of the constriction type microbridge junction due to the extremely thin construction of the superconductive film layers and the constricted bridge connecting the two layers.

SUMMARY OF THE INVENTION

A microbridge device for use in a superconductive quantum interference device comprising a supporting substrate and a first element of superconductive material carried on the substrate. A second element of superconductive material is carried on the substrate adjacent the first element defining a space therebetween. A connecting means bridging the space and connecting the first and second elements to establish an electrical weak link therebetween. A coating of semiconductor material is provided adjacent said first and second elements and said space electrically shunting said connecting means at room temperatures to prevent the destruction of said device by minute currents while acting as a dielectric and permitting unaffected electrical behavior at cryogenic temperatures. The coating also reduces the self-heating effects of the microbridge and extends its operating range.

Accordingly, an important objective of the present invention is to provide a microbridge device which is protected against destruction by minute electrical currents at room temperature in such a manner as to permit normal electrial behavior at cryogenic temperatures.

Another important object of the present invention is to provde a microbridge device wherein malfunctioning due to self-heating effects is reduced and the operating range of temperatures is extended.

Another important object of the present invention is to provide an improved microbridge device having a coating of semiconductor material for electrically shunting the device at room temperatures while permitting normal electrical behavior at cryogenic temperatures and wherein the coating has high thermal conductivity at cryogenic temperatures providing a heat sink which extends the temperature range of operation of the microbridge.

Yet another important object of the present invention is to provide a method for protecting microbridges from destruction by minute currents at room temperature which eliminate elaborate protection techniques.

BRIEF DESCRIPTION OF THE DRAWING

The construction designed to carry out the invention will be hereinafter described, together with other features thereof.

The invention will be more readily understood from a reading of the following specification and by reference to the accompanying drawing forming a part thereof, wherein an example of the invention is shown and wherein.

DESCRIPTION OF A PREFERRED EMBODIMENT

Figure 1:
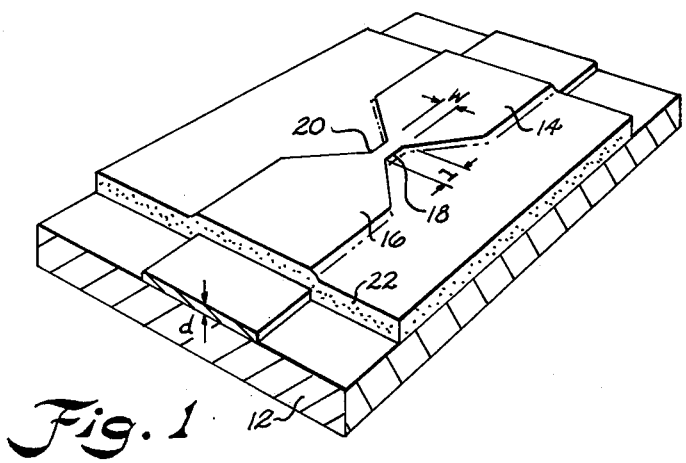
FIG. 1 is a cut-away perspective view illustrating a microbridge device constructed in accordance with the present invention.

The present invention has application to Josephson elements which basically include two bulk superconductors connected by a "weak link". The basic requirement for the weak link is that the amplitude of the order parameter should be substantially smaller than in the bulk superconductors. This situation has been realized in a variety of constructions. For example, two bulk superconductors joined by a small point contact, or two superconducting films separated by a very small spacing (usually an insulator of approximately twenty angstroms thickness).

Alternately, a microbridge of the Dayem or constriction type can be used wherein two large areas joined by a very small bridge are fabricated in a thin superconducting film. Collectively, all such weak link junctions are referred to as "Josephson junctions or elements" and exhibit what is known as "Josephson effects".

At cryogenic temperatures near absolute zero, these Josephson junctions become superconducting and are highly sensitive to extremely small currents, voltages, and magnetic fields. As the temperature of the superconductive metals approaches the transition temperature (Tc) the degree of order among the electrons is changed and quantum mechanics is applied to describe those electrons which become superconductive and which thereafter develop long-range quantum-mechanical phase coherence. The application of these Josephson junctions has been used to develop a family of devices called SQUIDS (superconducting quantunm interference devices) which are used to measure these extremely small currents, voltages, and magnetic fields.

Since the method and construction of the present invention may be applied for protecting any of the conventional "Josephson elements", and since such elements are well known in the art, it will be unnecessary to disclose or describe such elements in detail herein. Moreover, since the application of the present invention is essentially the same with any of the conventional Josephson elements, it will be unnecessary to illustrate all of them herein, and have accordingly chosen to illustrate the invention in connection with the constriction mirobridge type, though without necessary or implied limitation thereto. Accordingly, the drawing illustrates application of the invention with a constriction type microbridge circuit.

Referring now in detail to the drawing, a microbridge device is illustrated generally at 10 comprising a supporting substrate 12 such as corning 7059 glass. A first element 14 of superconductive material is carried on the substrate 12 and a second element of superconductive material 16 is carried on the substrate 12 adjacent the first element 14 defining a space 18 therebetween having a dimension 1.

A connecting means is provided by a constriction bridge 20 bridging the space and connecting the first and second elements, 14 and 16, to establish a weak electrical link or junction therebetween. The bridge 20 as well as the superconductive elements 14 and 16 are preferably formed as a thin film layer from niobium. The fabrication of the microbrige device as described can be done in any conventional manner, however, in the preferred embodiment such is fabricated by a sputtering technique which combines "bias" and "getter" techniques as described by Holdeman and Peters in "Niobium Microbridges for Squid Applications" which appears on pages 782 through 784 of the *IEEE Transactions on Magnetics,* Volume Mag-11, (1974). Depositing thin layers of metals in Josephson devices by sputtering and evaporation is also fully discussed in U.S. Letters Pat. No. 3,852,795.

After the microbridge device is formed in the above manner, the invention contemplates coating the microbrige device with a semiconductor material 22 to protect the device from destruction at room temperatures. In the preferred embodiment, germanium is used as the overcoating material although, in principle, other semiconductors can be used. However, the semiconductor germanium shunts the microbridge electrically at room temperature to protect the device against minute currents, yet behaves like a dielectric or high resistance material at liquid helium temperatures and does not significantly modify its weak-link characteristics. Even the most minute noise or electrical current induced in the bridge at room temperature can destroy and burn out the microbridge. Also, the thermal conductivity of germanium is high at liquid helium temperatures and the germanium overcoat can thermally shunt the microbridge in this temperature range providing a heat sink which helps eliminate self-heating effects.

The germanium is preferably sputtered over the microbridge using the same sputtering technique described in the fabrication of the microbridge. The germanium completely covers the niobium elements 14 and 16, bridges 20, fills in the space 18 to shunt the bridge at room temperatures while acting as a dielectric and heat sink at cryogenic temperatures enhancing bridge behavior.

In one embodiment of the invention a microbridge with a width (w) and length (l) of 0.7μm and a thickness (d) of 15nm was utilized. The bridge dimensions were obtained from a photomicrograph taken at two thousand times magnification and film thickness was calculated from a known sputtering rate (Holeman and Peters, supra). The weak link had a transition temperature (Tc) equal to 6.85 K and a normal state resistance of two ω.

Figure 2:
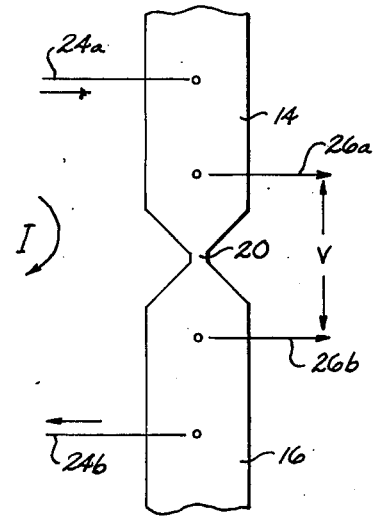
FIG. 2 is a schematic view illustrating the four-terminal hookup for making measurements in the microbridge device.

FIG. 2 illustrates schematically a conventional 4-terminal setup of a microbridge for measuring the current-voltage (I–V) characteristics of the bridge. A calibrated current source provides a current (I) through the bridge 20 via terminals 24a and 24b. The voltage (V) across the bridge is then measured at terminals 26a and 26b.

Figure 3:
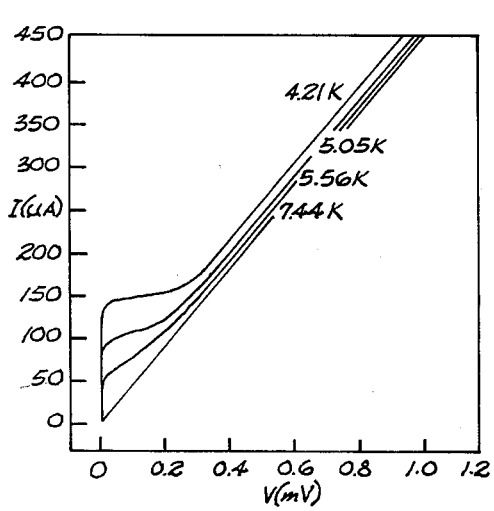
FIG. 3 is a graphical view illustrating the current-voltage characteritics of a microbridge device before coating with germanium.

Before coating, voltage traces (IV) showed a typical weak link pattern as illustrated in FIG. 3, although bridge characteristics were dominated by self-heating effects. Microwave-induced current steps, the hallmark of Josephson behavior were not observed. Also, the current voltage curve showed hysteresis at temperatures much less than Tc.

Figure 4:
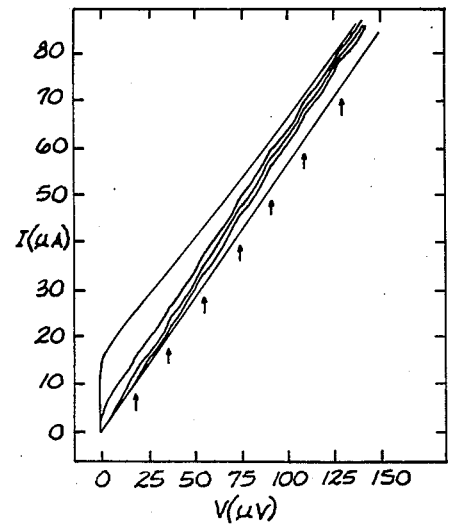
FIG. 4 is a graphical view illustrating the current-voltage characteristics of a microbridge device coated with germanium in accordance with the present invention and irradiated with five levels of microwave power.

The above microbridge circuit was then coated with germanium by the above mentioned sputtering technique. From the known sputtering rate measured in fabricating the niobium microbridge, the thickness of the germanium film was estimated to be about 1.2 micron. The current voltage characteristics were essentially unchanged after overcoating, but no longer showed any hysteresis effect down to 4.2K which is about 2.6° below the transition temperature Tc. With the coated microbridge taped to the open end of a section of X-band wave guide, the steps in the current voltage characteristics were induced. A set of current voltage traces at 5.9° K and for five different microwave energy levels are presented in FIG. 4 showing steps for the bridge irradiated at a frequency of 8.87GHz. The position of the steps in the trace line is indicated above each arrowhead. Each line represents a different level of microwave power irradiating the junction while current voltage measurements were made. Current steps could still be observed at a temperature 2.6° below the transition temperature which was the lowest temperature that could be reached with the particular test set up being utilized.

As mentioned above, microbridges must be protected from electrical disturbances at room temperatures. The germanium overcoat alone provided adequate protection for the microbridge devices constructed in accordance with the present invention. After constructing microbridges in accordance with the present invention, the microbridges were checked for continuity with two different multimeters both of them on the ten-K scale. Every uncoated microbridge tested in this manner was destroyed and the few that were not burned out or open circuited were no longer superconducting. However, the germanium overcoated microbridges survived and the current voltage traces of these microbridges are the ones shown in FIG. 4.

As mentioned above, the microbridge device is coated with germanium using a conventional sputtering technique. However, it has been found that an improved coating technique is provided by forming a thin oxide layer at the germanium/superconductor metal interface which significantly retards the dissolution of the germanium into the superconductive metal. This additional coating procedure proved sufficient to prevent the interdiffusion of the germanium and niodium which can readily occur at temperatures well below the melting point of any components of the composite.

In addition, the conventional sputtering process was modified by allowing the substrate 12 to cool for approximately one hour before the germanium is deposited. During the germanium deposition, two minutes of sputtering were alternated with three minutes of cooling until the desired thickness of germanium was attained. Both of these cooling techniques tend to prevent heating of the niobium film during the germanium coating process which further reduces the tendency of the germanium and niobium to interdiffuse.

The preferred coating process for the germanium overcoat can thus be summarized as follows. After allowing the microbridge to cool approximately 1 hour with the sputtering chamber kept under a vacuum, an oxide layer is formed by exposure to air or oxygen; the only limitation is that the temperature of the niobium film should be less than 115° C while exposed to air (higher temperatures destroyed the superconducting properties). The germanium target is then presputtered for 40 minutes. After the presputtering, the germanium is deposited on the niobium for approximately two minutes. After the deposition, the sputtering supply is turned off and the system allowed to cool for approximately three minutes before the next sputtering period of 2 minutes is begun. This process is repeaed until the desired thickness of germanium overcoating is achieved. An r.f. sputtering voltage of 0.700 KV was used. It is to be understood, of course, that other coating techniques are feasible for coating the microbridge with germanium such as electron-beam evaporation.

Thus, it can be seen that an advangageous construction method for a microbridge can be had in accordance with the present invention which makes possible their application in SQUIDS. The germanium coated microbrige constructed in accordance with the present invention overcomes the problem of microbridge destruction by minute currents at room temperatures and the problems which have heretofore limited the temperature range of operation of microbridges due to self-heating effects. This method of protection may also be applied to other "Josephson junctions" without departing from the principle of the present invention.

While a preferred embodiment of the invention has been described using specific terms, such description is for illustrative purposes only, and it is to be understood that changes and variations may be made without departing from the spirit or scope of the following claims.

What is claimed is:

1. A microbridge device for use in a superconductive quantum interference device comprising:
   a supporting substrate;
   a first element of superconductive material carried on said substrate;
   a second element of superconductive material carried on said substrate adjacent said first element defining a space therebetween;
   connecting means bridging said space and connecting said first and second elements to establish an electrical weak link therebetween;
   a coating of semiconductor material adjacent said first and second elements and said space electrically shunting said connecting means at room temperatures to prevent the destruction of said device by minute currents while acting as a dielectric permitting normal electrical behavior at cryogenic temperatures.

2. The device as set forth in claim 1 further comprising a thin layer of oxide formed intermediate said semiconductor coating and said superconductive elements and connecting means reducing the interdiffusion of said superconductive and semiconductor materials.

3. The device as set forth in claim 1 wherein said semiconductor material is germanium.

4. The device as set forth in claim 1 wherein said weak link includes a construction bridge formed from the same superconductive material as said first and second elements.

5. The device as set forth in claim 1 wherein said first and second elements are each carried directly on said substrate with horizontal spacing therebetween defining said space.

6. A method of protecting a weak link electrical device against destruction by minute currents at room temperature, the device having a supporting substrate, a pair of superconductive elements carried on said substrate with a finite space therebetween, and connecting means bridging said space and connecting said first and second superconductive element to establish a weak electrical link therebetween; said method comprising coating said fist and second superconductive elements with a semiconductor material which electrically shunts said connecting means at room temperature to prevent the destruction of said device by minute currents while acting as a dielectric and permitting normal electrical behavior of said device at cryogenic temperatures.

7. The method as set forth in claim 6 further comprising forming a thin layer of oxide adjacent said first and second superconductive elements prior to coating said elements with said semiconductor material so as to reduce the interdiffusion of said superconductive and semiconductive materials.

8. The method of claim 7 wherein said semiconductor material is germanium.

9. The method of claim 6 wherein said coating is formed by alternate periods of depositing a thin layer of said semiconductor material and allowing said material to cool until a desired coating thickness is formed.

* * * * *